United States Patent
Chi (10) Patent No.: US 8,697,566 B2
(45) Date of Patent: Apr. 15, 2014

(54) BUMP STRUCTURE AND MANUFACTURING METHOD THEREOF

(75) Inventor: Chung-Pang Chi, Hsinchu (TW)

(73) Assignee: ChipMOS Technologies Inc., Hsinchu (TW)

(*) Notice: Subject to any disclaimer, the term of this patent is extended or adjusted under 35 U.S.C. 154(b) by 136 days.

(21) Appl. No.: 13/225,488

(22) Filed: Sep. 5, 2011

(65) Prior Publication Data

US 2012/0153460 A1   Jun. 21, 2012

(30) Foreign Application Priority Data

Dec. 21, 2010   (TW) ................................ 99144947 A (51) Int. Cl.
*H01L 21/44* (2006.01)
*H01L 23/52* (2006.01)
*H01L 23/48* (2006.01)
*H01L 23/485* (2006.01)
*H01L 23/488* (2006.01)

(52) U.S. Cl.
USPC ........... 438/613; 438/612; 438/614; 257/780; 257/781; 257/779; 257/E23.021; 257/E23.023

(58) Field of Classification Search
USPC ........... 438/614, 612, 613; 257/779, 780, 781
See application file for complete search history.

(56) References Cited

U.S. PATENT DOCUMENTS

| | | | | |
|---|---|---|---|---|
| 5,656,863 | A * | 8/1997 | Yasunaga et al. | 257/778 |
| 6,467,674 | B1 * | 10/2002 | Mihara | 228/164 |
| 6,479,900 | B1 * | 11/2002 | Shinogi et al. | 257/758 |
| 2004/0099959 | A1 | 5/2004 | Tang | |
| 2008/0299757 | A1 * | 12/2008 | Wen | 438/614 |
| 2011/0193218 | A1 * | 8/2011 | Arvin et al. | 257/737 |

FOREIGN PATENT DOCUMENTS

TW   200849422   12/2008

OTHER PUBLICATIONS

"Office Action of Taiwan Counterpart Application", issued on Jan. 27, 2014, p. 1-p. 7.

* cited by examiner

*Primary Examiner* — Luan C Thai
(74) *Attorney, Agent, or Firm* — Jianq Chyun IP Office (57) ABSTRACT

A manufacturing method of a bump structure is provided. A substrate having at least one pad and a passivation layer is provided. The passivation layer has at least one first opening exposing the pad. An insulating layer is formed on the passivation layer. The insulating layer has at least one second opening located above the first opening. A metal layer is formed on the insulating layer. The metal layer electrically connects the pad through the first and second openings. A first bump is formed in the first and second openings. A second bump is formed on the first bump and a portion of the metal layer. The metal layer not covered by the second bump is partially removed by using the second bump as a mask, so as to form at least one UBM layer. The first bump is completely covered by the UBM layer and the second bump.

16 Claims, 8 Drawing Sheets

BUMP STRUCTURE AND MANUFACTURING METHOD THEREOF

CROSS-REFERENCE TO RELATED APPLICATION

This application claims the priority benefit of Taiwan application serial no. 99144947, filed on Dec. 21, 2010. The entirety of the above-mentioned patent application is hereby incorporated by reference herein and made a part of this specification.

BACKGROUND OF THE INVENTION

1. Field of the Invention

The invention relates to a semiconductor structure and a manufacturing method of the same. More particularly, the invention relates to a bump structure and a manufacturing method thereof.

2. Description of Related Art

In a fabricating process of a semiconductor, a conductive bump is required to be formed on each pad of the wafer structure that will serve as a flip-chip package, and the conductive bump that transmits electric signals includes a solder bump, a gold bump, a copper bump, a conductive polymer bump, a polymer bump, and so on. When an electric field is applied to the bumps, stress resulting from electro-migration is generated. Namely, when the bumps made of metal materials conduct electricity, metallic atoms of the bumps migrate along the grain boundary of the material and move toward the current-flow direction, which leads to the reduction of the sectional area of the bumps and finally causes an open circuit. Accordingly, it is necessary to form the so-called under bump metallurgic (UBM) layer between the bumps and pads, so as to enhance the bonding strength between the bumps and the pads and prevent the electro-migration phenomenon.

However, since the conventional UBM layer is merely configured below the bumps, an under cut effect is likely to be generated when there are cracks between the UBM layer and the bumps or between the UBM layer and the passivation layer that is located above the pads. Moreover, the bumps must have certain height, such that the bumps can be electrically connected to a circuit board or any other carrier. Hence, given the gold bumps are applied, the higher the gold bumps, the more the manufacturing costs. By contrast, when the gold bumps are replaced by the copper bumps, the manufacturing costs can be reduced. Nevertheless, copper is apt to be oxidized, which may give rise to the reduction of the bonding reliability between the bumps and the UBM layer.

SUMMARY OF THE INVENTION

The invention is directed to a bump and a manufacturing method thereof in order to prevent the under cut effect and ensure favorable bonding reliability.

In an embodiment of the invention, a manufacturing method of a bump structure is provided. First, a substrate is provided. The substrate has at least one pad and a passivation layer. The passivation layer has at least one first opening to expose the pad. An insulating layer is formed on the passivation layer. The insulating layer has at least one second opening that is located above the first opening. A metal layer is formed on the insulating layer. Here, the metal layer is electrically connected to the pad through the first opening and the second opening. A first bump is formed in the first and second openings. A second bump is formed on the first bump and a portion of the metal layer. A portion of the metal layer which is not covered by the second bump is removed with use of the second bump as a mask, so as to form at least one UBM layer. The first bump is completely covered by the UBM layer and the second bump.

According to an embodiment, the step of forming the first bump includes following steps. A first patterned photoresist layer is formed on the insulating layer. The first patterned photoresist layer has at least one third opening corresponding to the second opening. A diameter of the third opening is substantially equal to a diameter of the second opening, and the third opening exposes a portion of the metal layer located in the first opening and the second opening. The first bump is formed in the first opening and the second opening. Here, the first bump fills the first opening and the second opening, and a portion of the metal layer is located between the first bump and the insulating layer. The first patterned photoresist layer is removed to expose a portion of the metal layer located below the first patterned photoresist layer.

According to an embodiment of the invention, a nickel layer is formed on the first bump before the second bump is formed on the first bump.

According to an embodiment of the invention, the nickel layer is formed on the first bump before the first patterned photoresist layer is removed.

According to an embodiment of the invention, the nickel layer is formed on the first bump after the first patterned photoresist layer is removed.

According to an embodiment of the invention, the nickel layer extends and is configured between the second bump and a portion of the metal layer located on the insulating layer.

According to an embodiment of the invention, the step of forming the second bump includes following steps. A second patterned photoresist layer is formed on a portion of the metal layer located on the insulating layer. The second patterned photoresist layer has at least one fourth opening corresponding to the at least one second opening. The fourth opening exposes the first bump located in the first opening and the second opening and exposes a portion of the metal layer located on the insulating layer. The second bump is formed in the fourth opening. Here, the second bump is stacked on the first bump. The second patterned photoresist layer is removed to expose a portion of the metal layer located below the second patterned photoresist layer.

In an embodiment of the invention, a bump structure is adapted to be configured on a substrate. The substrate has at least one pad and a passivation layer that has at least one opening exposing a portion of the pad. The bump structure includes an insulating layer, an UBM layer, a first bump, and a second bump. The insulating layer is configured on the passivation layer and has at least one second opening. The second opening exposes a portion of the passivation layer and a portion of the pad. The UBM layer is configured on a portion of the insulating layer, in the first opening, and in the second opening. Here, the UBM layer covers an inner wall of the first opening, an inner wall of the second opening, and a portion of the passivation layer exposed by the second opening. The first bump fills the first opening and the second opening. A portion of the UBM layer is located between the first bump and the insulating layer. The second bump is stacked on the first bump and covers the first bump. A portion of the second bump extends to a portion of the UBM layer that is located on the insulating layer.

According to an embodiment of the invention, the first bump is a copper bump, and the second bump is a gold bump.

According to an embodiment of the invention, the bump structure further includes a nickel layer configured between the first bump and the second bump.

According to an embodiment of the invention, a bottom area of the nickel layer is greater than or substantially equal to an area of a diameter of the second opening.

According to an embodiment of the invention, a top surface of the first bump is a planar surface.

According to an embodiment of the invention, a bottom area of the second bump is greater than or substantially equal to an area of a diameter of the second opening.

Based on the above, the first bump of the invention is completely covered by the UBM layer and the second bump, the UBM layer is covered by the insulating layer, and a portion of the UBM layer located on the insulating layer is covered by the second bump. Hence, the under cut effect on the bump structure of the invention is rather unlikely to occur. Moreover, the bonding reliability of the bumps and the UBM layer is favorable.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

FIG. 2A to FIG. 2I are schematic cross-sectional views illustrating a manufacturing method of a bump structure according to an embodiment of the invention.

DESCRIPTION OF EMBODIMENTS

Figure 1:
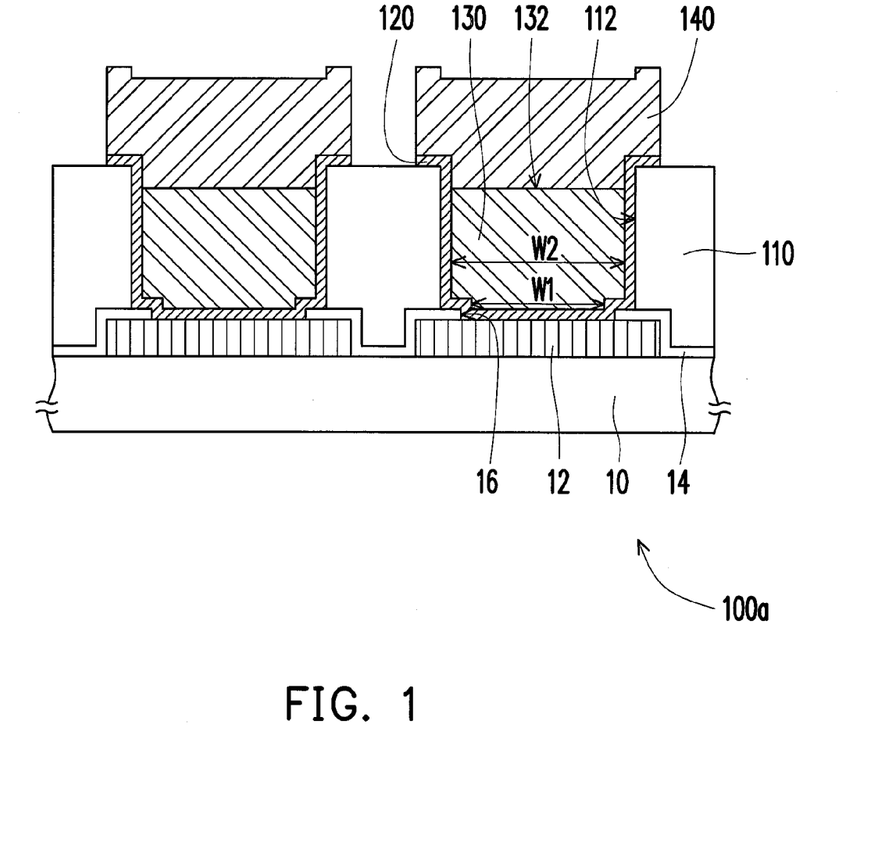
FIG. 1 is a schematic cross-sectional view illustrating a bump structure according to an embodiment of the invention.

FIG. 1 is a schematic cross-sectional view illustrating a bump structure according to an embodiment of the invention. With reference to FIG. 1, in this embodiment, the bump structure 100a is adapted to be configured on a substrate 10, and the substrate 10 has at least one pad 12 and a passivation layer 14. In FIG. 1, two pads 12 are schematically depicted. Specifically, the passivation layer 14 has at least one first opening 16. In FIG. 1, two first openings 16 are schematically depicted. The first openings 16 expose a portion of the pads 12. The substrate 10 is a circuit board or a wafer, for instance. The pads 12 are made of aluminum, copper, or any other appropriate metal, for instance.

The bump structure 100a of this embodiment includes an insulating layer 110, an UBM layer 120, a first bump 130, and a second bump 140. Two bump structures 100a are schematically illustrated in FIG. 1. More specifically, the insulating layer 110 is configured on the passivation layer 14 and has at least one second opening 112. In FIG. 1, two second openings 112 are schematically depicted. In each bump structure 100a, the second opening 112 exposes a portion of the passivation layer 14 and a portion of the pad 12, and a diameter of the second opening 112 is greater than a diameter of the first opening 16. The UBM layer 120 is configured on a portion of the insulating layer 110, in the first opening 16, and in the second opening 112. Here, the UBM layer 120 covers an inner wall of the first opening 16, a portion of the pad 12 which is exposed by the first opening 16, an inner wall of the second opening 112, and a portion of the passivation layer 14 which is exposed by the second opening 112.

The first bump 130 fills the first and second openings 16 and 112. The UBM layer 120 covers the inner wall of the first opening 16 and the inner wall of the second opening 112, such that a portion of the UBM layer 120 is located between the first bump 130 and the insulating layer 110. More particularly, the height of the first bump 130 in this embodiment is less than the depth of the second opening 112, and the first bump 130 is a copper bump, for instance. It should be mentioned that the first bump 130 has a first width W1 and a second width W2. The first width W1 is slightly less than the diameter of the first opening 16, and the second width W2 is slightly less than the diameter of the second opening 112. Here, the second width W2 is greater than the first width W1. The second bump 140 is stacked on the first bump 130 and covers the top surface of the first bump 130. A portion of the second bump 140 extends to a portion of the UBM layer 120 located on the insulating layer 110, and another portion of the second bump 140 is located in the second opening 112 and connected to the first bump 130. Besides, the second bump 140 of this embodiment is a gold bump, for instance. It should be mentioned that the first bump 130 and the second bump 140 can be made of other appropriate metallic materials in other embodiments of the invention, which should not be construed as a limitation to the invention. For instance, the first bump 130 can be made of palladium, and the second bump 140 can be made of gold, for instance.

In the bump structure 100a, the first bump 130 is completely covered by the UBM layer 120 and the second bump 140, and thus the under cut effect on the bump structure 100a is less likely to occur. Besides, the first bump 130 made of the copper material is completely covered by the UBM layer 120 and the second bump 140 which is made of the gold material, the UBM layer 120 is covered by the insulating layer 110, and a portion of the UBM layer 120 located on the insulating layer 110 is covered by the second bump 140. As such, metal oxidization can be effectively prevented, and the bonding reliability between the first and second bumps 130 and 140 and the UBM layer 120 can be enhanced. In comparison with the conventional bump structure, the bump structure 100a is not entirely made of the gold bump. Instead, the bump structure 100a has the first bump 130 made of the copper material and the second bump 140 made of the gold material, and the first and second bumps 130 and 140 are stacked. Thereby, the manufacturing costs can be effectively lowered down.

The manufacturing method of the aforesaid bump structure 100a is elaborated in the following embodiment with reference to FIG. 2A to FIG. 2I.

Figure 2A:
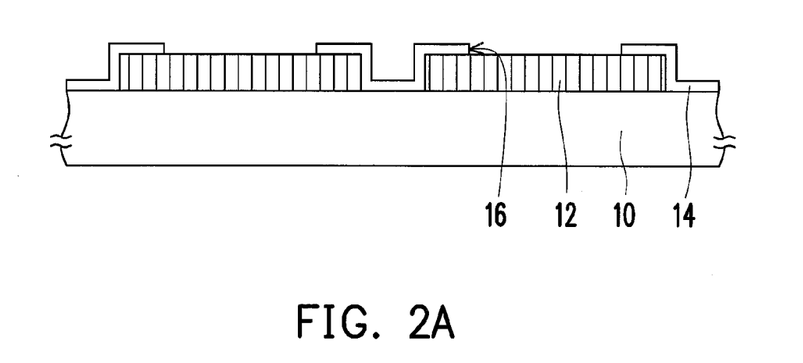

FIG. 2A to FIG. 2I are schematic cross-sectional views illustrating a manufacturing method of a bump structure according to an embodiment of the invention. With reference to FIG. 2A, the bump structure in the embodiment includes following steps. First, a substrate 10 is provided. The substrate 10 has at least one pad 12 and a passivation layer 14. The passivation layer 14 has at least one first opening 16 to expose the pad 12. In FIG. 2A, two first openings 16 are depicted. The substrate 10 is a circuit board or a wafer, for instance. The pad 12 is made of aluminum, copper, or any other appropriate metal, for instance.

Figure 2B:
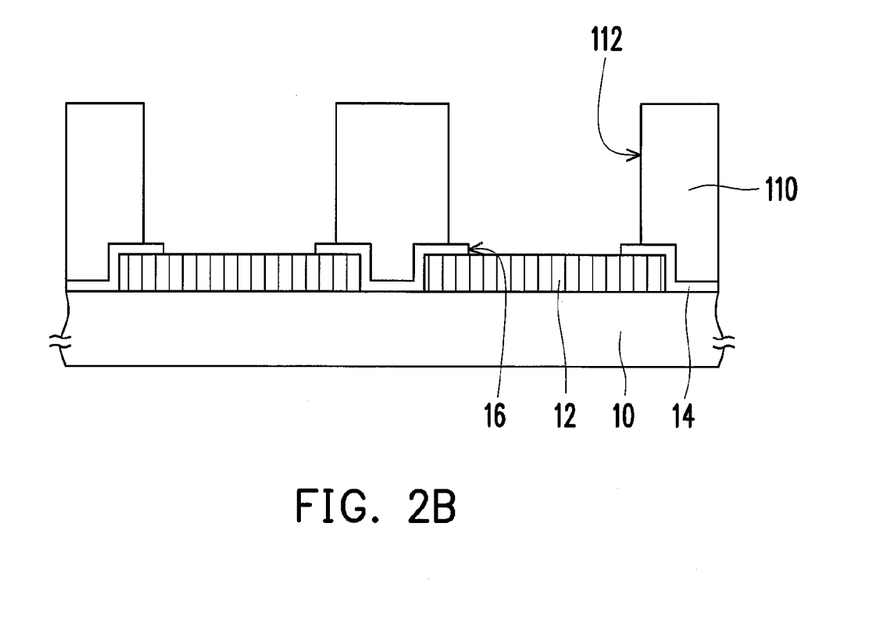

With reference to FIG. 2B, an insulating layer 110 is formed on the passivation layer 14. Here, the insulating layer 110 has at least one second opening 112 located above the first opening 16. In FIG. 2A, two second openings 112 are schematically depicted. In this embodiment, the diameter of the second opening 112 is substantially greater than the diameter of the first opening 16.

Figure 2C:
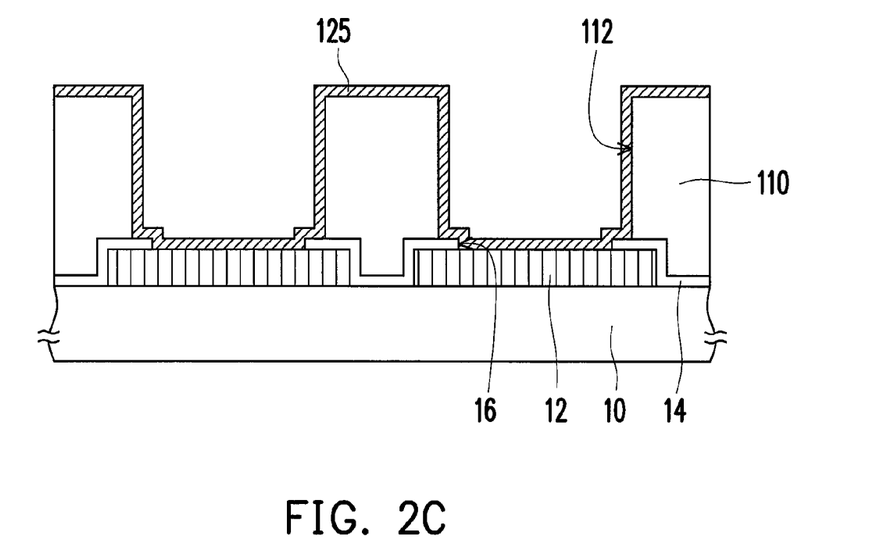

As indicated in FIG. 2C, a metal layer 125 is formed on the insulating layer 110. Here, the metal layer 125 is electrically connected to the pad 12 through the first and second openings 16 and 112. The metal layer 125 can be formed by performing a sputtering process, a physical vapor deposition (PVD) process, or a chemical vapor deposition (CVD) process.

Figure 2D:
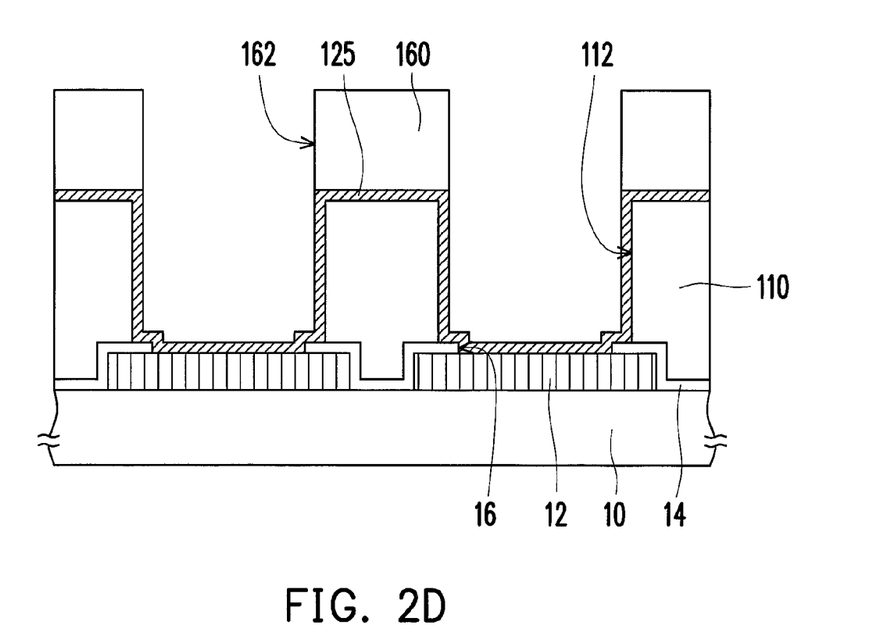

With reference to FIG. 2D, a first patterned photoresist layer 160 is formed on the insulating layer 110. The first patterned photoresist layer 160 has at least one third opening 162 corresponding to the second opening 112. In FIG. 2D, two third openings 162 are schematically depicted. A diameter of the third opening 162 is substantially equal to the diameter of the second opening 112, and the third opening 162 exposes a portion of the metal layer 125 located in the first and second openings 16 and 112.

Figure 2E:
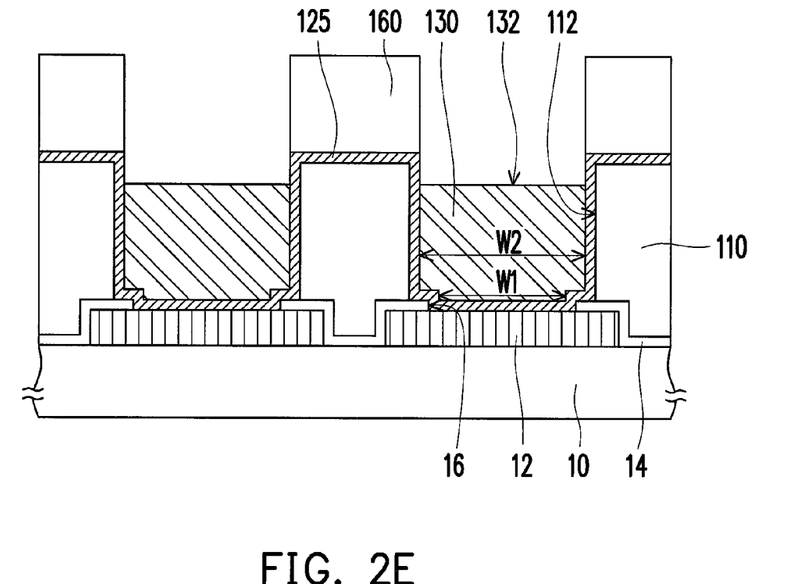

As indicated in FIG. 2E, a first bump 130 is formed in the first and second openings 16 and 112. Here, the first bump 130 fills the first and second openings 16 and 112, and a portion of the metal layer 125 is located between the first bump 130 and the insulating layer 110. In this embodiment, the height of the first bump 130 is less than the depth of the second opening 112, and the first bump 130 is a copper bump, for instance. Besides, the first bump 130 is formed by performing an electroplating process, for instance.

Figure 2F:
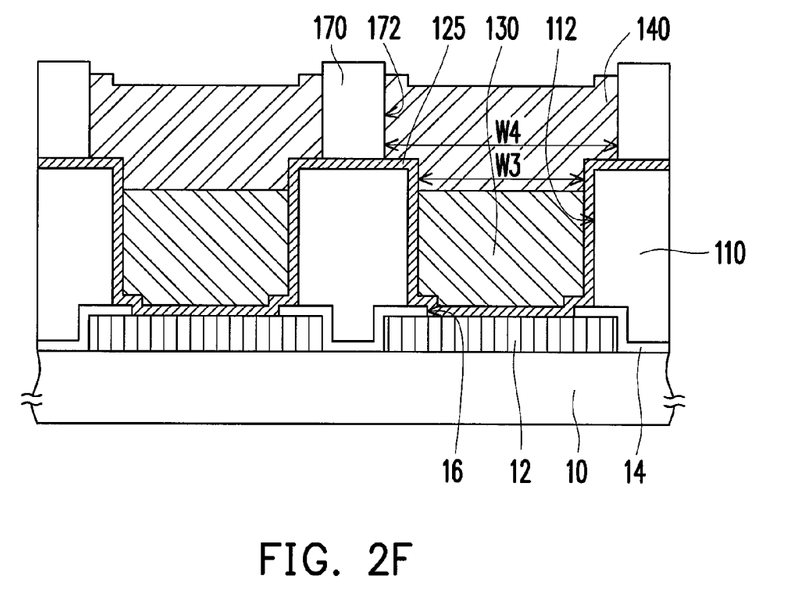

With reference to FIG. 2F, the first patterned photoresist layer 160 is removed to expose a portion of the metal layer 125 located below the first patterned photoresist layer 160.

As shown in FIG. 2F, a second patterned photoresist layer 170 is formed on a portion of the metal layer 125 located on the insulating layer 110. The second patterned photoresist layer 170 has at least one fourth opening 172 corresponding to the second opening 112. In FIG. 2F, two fourth openings 172 are schematically depicted. Here, each of the fourth openings 172 exposes the first bump 130 located in the first and second openings 16 and 112 and exposes a portion of the metal layer 125 located on the insulating layer 110.

With reference to FIG. 2F, the second bump 140 is formed in the fourth opening 172, and the second bump 140 is stacked on the first bump 130. The bottom area of the second bump 140 is greater than the area of the diameter of the second opening 112. In detail, a portion of the second bump 140 is located in the second opening 112 and covers the first bump 130, and a portion of the second bump 140 located outside the second opening 112 covers a portion of the metal layer 125 located on the insulating layer 110. In this embodiment, the second bump 140 has a third width W3 and a fourth width W4. The third width W3 is slightly less than the diameter of the second opening 112, and the fourth width W4 is greater than the diameter of the second opening 112. Here, the bottom area of the second bump 140 is defined based on the fourth width W4 of the second bump 140. In addition, the second bump 140 of this embodiment is a gold bump, for instance, and the second bump 140 is formed by performing an electroplating process, for instance.

Figure 2G:
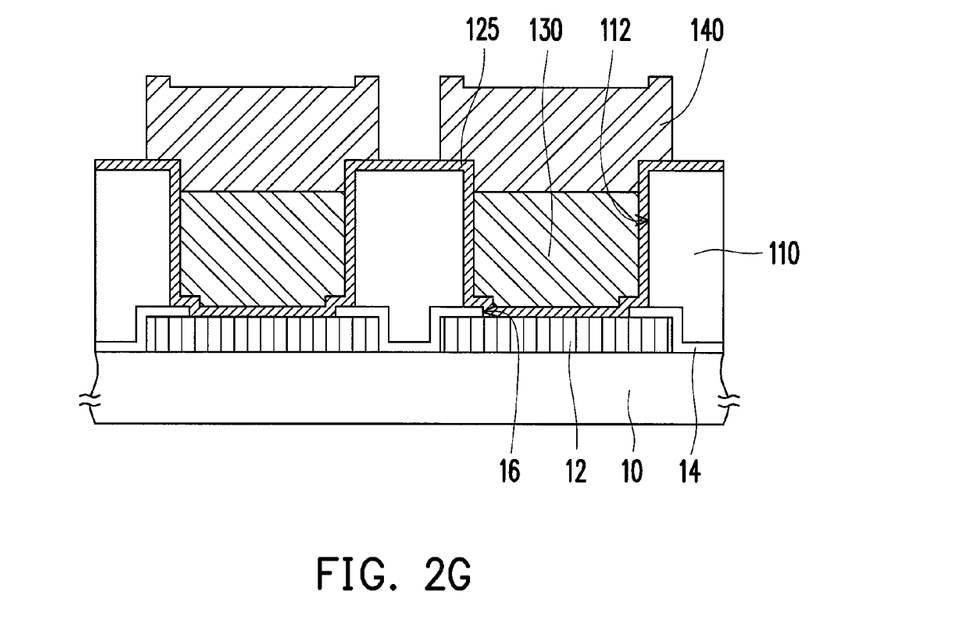

With reference to FIG. 2G, the second patterned photoresist layer 170 is removed to expose a portion of the metal layer 125 located below the second patterned photoresist layer 170.

Figure 2H:
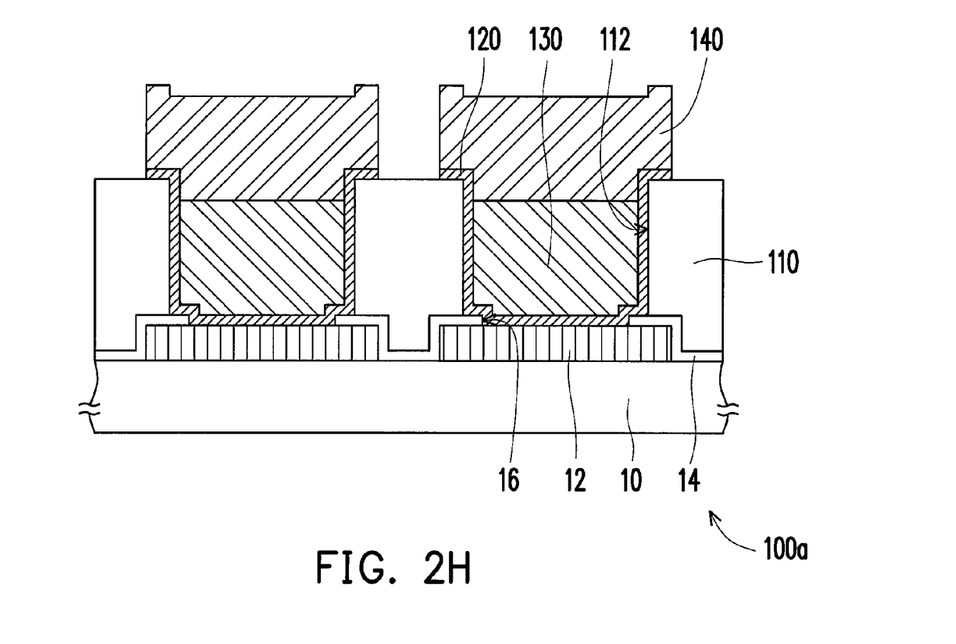

With reference to FIG. 2H, a portion of the metal layer 125 which is not covered by the second bump 140 is removed with use of the second bump 140 as a mask, so as to form at least one UBM layer 120. In FIG. 2H, two UBM layers 120 are schematically depicted. The first bump 130 is completely covered by the UBM layer 120 and the second bump 140. So far, the bump structure 100a is completely formed.

There is an insulating layer 110 located between the bump structures 100a. The insulating layer 110 surrounds the bump structures 100a and can prevent electro-migration of the adjacent bump structures and the oxidization of the UBM layers 120 located at the bottom of the bump structures. Moreover, when the bump structures are bonded to external devices, the insulating layer 110 can act as a buffer.

Figure 2I:
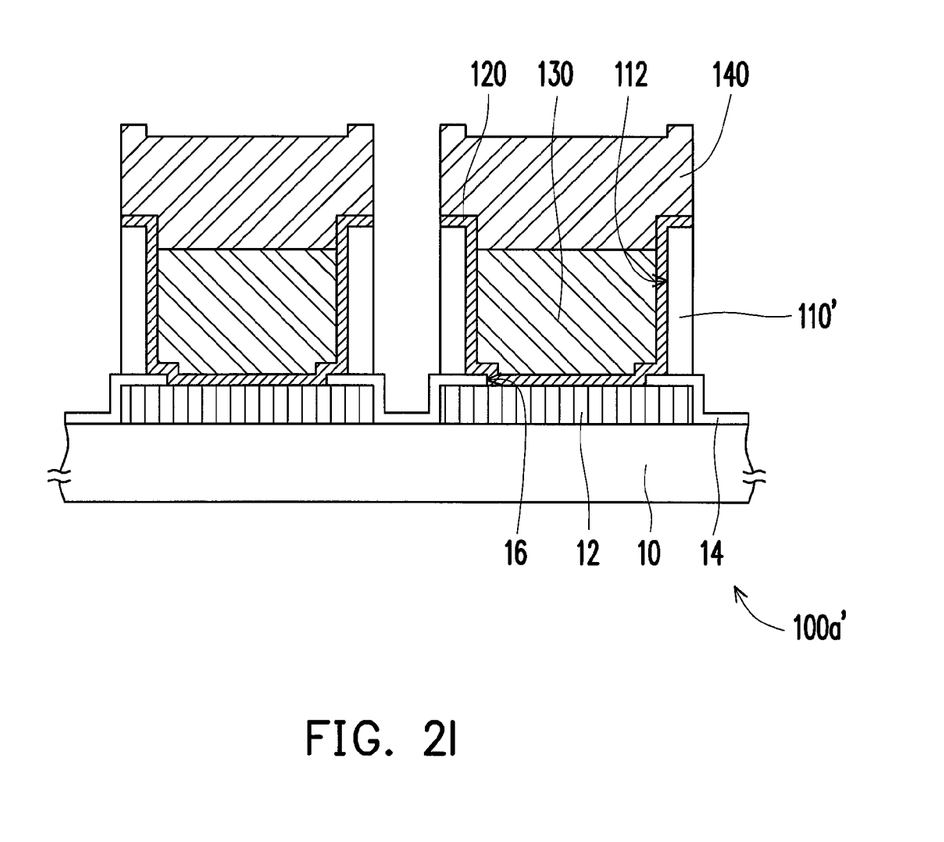

In this embodiment, a portion of the insulating layer 110 which is not covered by the second bump 140 and the UBM layer 120 can be further removed with use of the second bump 140 as a mask, such that an individual insulating layer 110' is formed around each of the bump structures 100a'. In FIG. 2I, two bump structures 100a' are schematically depicted. Here, the insulating layer 110' is a hollow insulating tube.

The bump structure and a manufacturing method thereof are described in the following embodiments. Note that the same reference numbers and some of the descriptions provided in the previous embodiments are also used in the following embodiments. The same reference numbers denote the same or like components, and descriptions of the same technical contents are omitted. The aforementioned embodiments can be referred for the descriptions of the omitted parts, and thus the omitted parts are not further described in the following embodiments.

Figure 3:
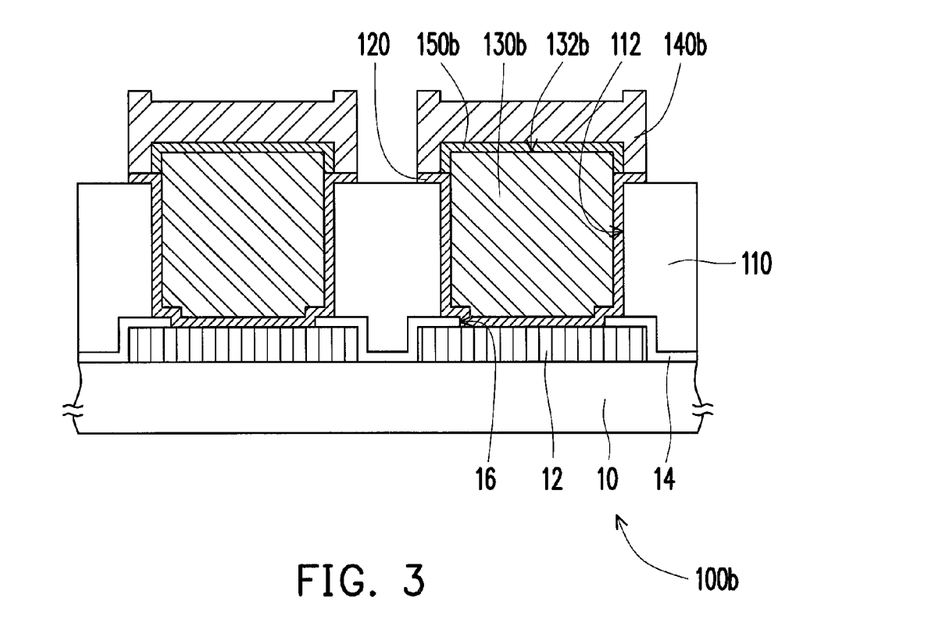
FIG. 3 is a schematic cross-sectional view illustrating another bump structure according to an embodiment of the invention.

FIG. 3 is a schematic cross-sectional view illustrating another bump structure according to an embodiment of the invention. With reference to FIG. 3, the bump structure 100b depicted therein is similar to the bump structure 100a depicted in FIG. 1, while the difference therebetween lies in that the bump structure 100b further includes a nickel layer 150b configured between the first and second bumps 130b and 140b. Specifically, in this embodiment, the height of the first bump 130b is greater than the depth of the second opening 112. Namely, the first bump 130b protrudes from the second opening 112. The nickel layer 150b covers the top surface 132 of the first bump 130b and connects the UBM layer 120. The first bump 130b is completely covered by the UBM layer 120 and the nickel layer 150b.

The bump structure 100b of this embodiment as depicted in FIG. 3 can be formed by performing similar steps for manufacturing the bump structure 100a depicted in FIG. 2A to FIG. 2H. In the step shown in FIG. 2D, the first bump 130b protrudes from the second opening 112. In the step shown in FIG. 2E, i.e., after the first patterned photoresist layer 160 is removed, the nickel layer 150b is formed on the first bump 130b to connect the UBM layer 120. The step of forming the second patterned photoresist layer 170 and the second bump 140b as shown in FIG. 2F and the steps shown in FIG. 2G to FIG. 2H are then performed, so as to completely form the bump structure 100b.

Figure 4:
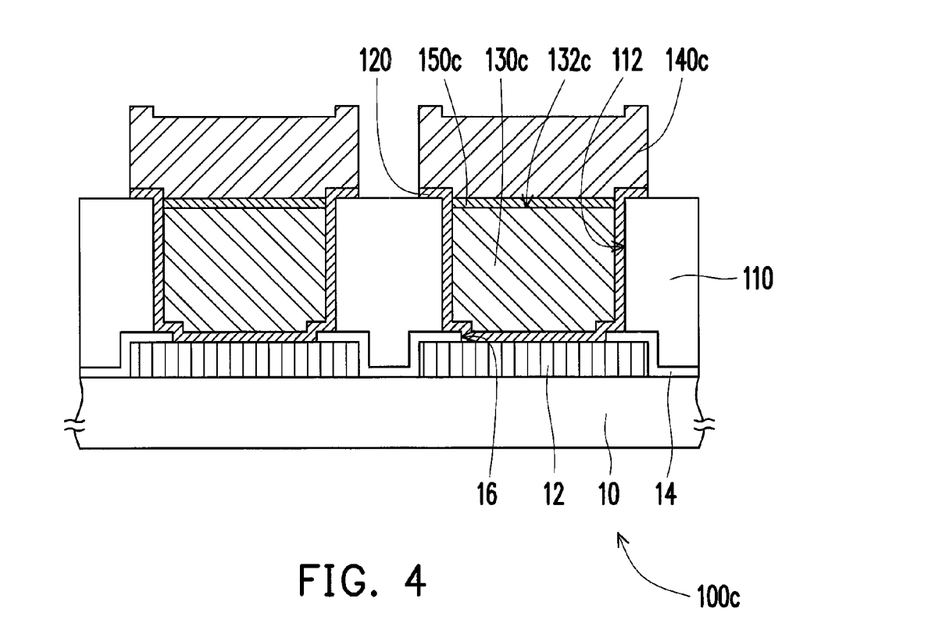
FIG. 4 is a schematic cross-sectional view illustrating another bump structure according to an embodiment of the invention.

FIG. 4 is a schematic cross-sectional view illustrating another bump structure according to an embodiment of the invention. The bump structure 100c depicted in FIG. 4 is similar to the bump structure 100b depicted in FIG. 3, while the difference therebetween lies in where the nickel layer 150c of the bump structure 100c is configured. To be more specific, the nickel layer 150c covers the top surface 132c of the first bump 130c, and the nickel layer 150c is located in the second opening 112. The surface of the nickel layer 150c away from the first bump 130c is substantially lower than or aligned to the surface of the insulating layer 110 which is not in contact with the passivation layer 14. The bottom area of the nickel layer 150c is substantially equal to the area of the diameter of the second opening 112.

The bump structure 100c of this embodiment as depicted in FIG. 4 can be formed by performing similar steps for manufacturing the bump structure 100a depicted in FIG. 2A to FIG. 2H. In the step shown in FIG. 2E, i.e., after the first bump 130c is formed and before the first patterned photoresist layer 160 is removed, the nickel layer 150c is formed on the first bump 130c. The step of forming the second patterned photoresist layer 170 and the second bump 140c as shown in FIG. 2F and the steps shown in FIG. 2G to FIG. 2H are then performed, so as to completely form the bump structure 100c.

Figure 5:
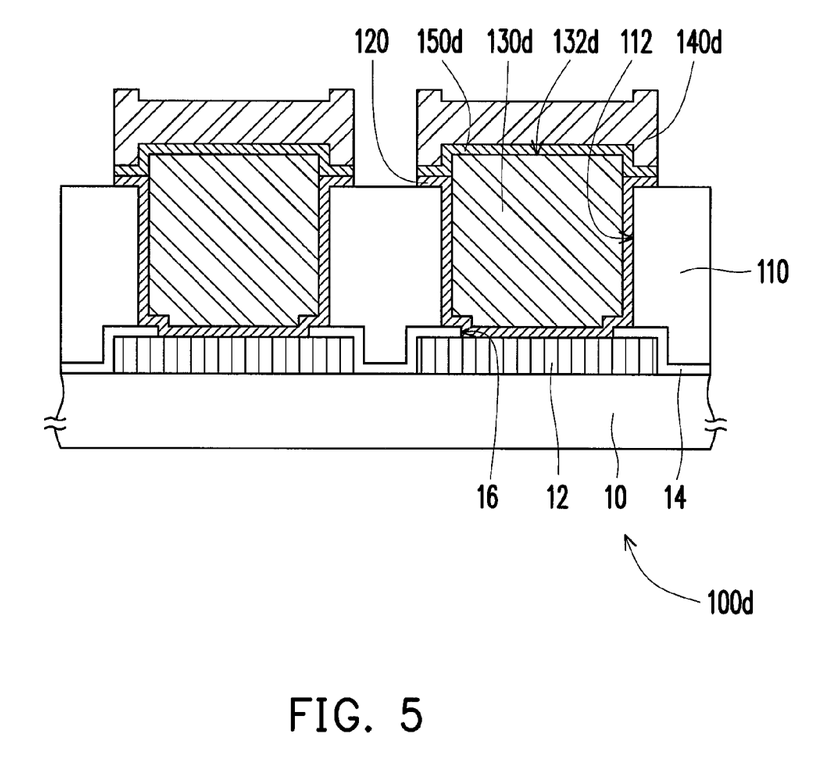
FIG. 5 is a schematic cross-sectional view illustrating still another bump structure according to an embodiment of the invention.

FIG. 5 is a schematic cross-sectional view illustrating still another bump structure according to an embodiment of the invention. The bump structure 100d depicted in FIG. 5 is similar to the bump structure 100b depicted in FIG. 3, while the difference therebetween lies in where the nickel layer 150d of the bump structure 100d is configured. In particular, the nickel layer 150d covers the top surface 132d of the first bump 130d. Besides, the nickel layer 150d extends and is configured between the second bump 140d and a portion of the UBM layer 120 located on the insulating layer 110. The bottom area of the nickel layer 150d is greater than the area of the diameter of the second opening 112.

The bump structure 100d of this embodiment as depicted in FIG. 5 can be formed by performing similar steps for manufacturing the bump structure 100a depicted in FIG. 2A to FIG. 2H. In the step shown in FIG. 2F, i.e., after the second patterned photoresist layer 170 is removed, the nickel layer 150d is formed on the first bump 130d. The step of forming the second patterned photoresist layer 170 and the second bump 140d as shown in FIG. 2F and the steps shown in FIG. 2G to FIG. 2H are then performed, so as to completely form the bump structure 100d.

In light of the foregoing, the first bump of the bump structure is completely covered by the UBM layer and the second bump, the UBM layer is covered by the insulating layer, and a portion of the UBM layer located on the insulating layer is covered by the second bump. Therefore, the under cut effect on the bump structure of the invention is rather unlikely to occur, metal oxidization can be effectively prevented, and the bonding reliability between the bumps and the UBM layer can be enhanced. Besides, in comparison with the conventional bump structure, the bump structure of this invention is not entirely made of the gold material, and thus the manufacturing costs can be effectively lowered down.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A manufacturing method of a bump structure, comprising:
   providing a substrate, the substrate having at least one pad and a passivation layer, the passivation layer having at least one first opening to expose the at least one pad;
   forming an insulating layer on the passivation layer, wherein the insulating layer has at least one second opening, and the at least one second opening is located above the at least one first opening;
   forming a metal layer on the insulating layer, wherein the metal layer is electrically connected to the at least one pad through the at least one first opening and the at least one second opening;
   forming a first bump in the at least one first opening and the at least one second opening, wherein a top surface of the first bump is lower than a top surface of the insulating layer;
   forming a second bump on the first bump and a portion of the metal layer; and
   removing a portion of the metal layer not covered by the second bump with use of the second bump as a mask, so as to form at least one under bump metallurgic layer, wherein the first bump is completely covered by the at least one under bump metallurgic layer and the second bump.

2. The manufacturing method of the bump structure as claimed in claim 1, wherein the step of forming the first bump comprises:
   forming a first patterned photoresist layer on the insulating layer, wherein the first patterned photoresist layer has at least one third opening corresponding to the at least one second opening, a diameter of the at least one third opening is substantially equal to a diameter of the at least one second opening, and the at least one third opening exposes a portion of the metal layer located in the at least one first opening and the at least one second opening;
   forming the first bump in the at least one first opening and the at least one second opening, wherein the first bump fills the at least one first opening and the at least one second opening, and a portion of the metal layer is located between the first bump and the insulating layer; and
   removing the first patterned photoresist layer to expose a portion of the metal layer located below the first patterned photoresist layer.

3. The manufacturing method of the bump structure as claimed in claim 2, further comprising:
   forming a nickel layer on the first bump before the second bump is formed on the first bump.

4. The manufacturing method of the bump structure as claimed in claim 3, wherein the nickel layer is formed on the first bump before the first patterned photoresist layer is removed.

5. The manufacturing method of the bump structure as claimed in claim 3, wherein the nickel layer is formed on the first bump after the first patterned photoresist layer is removed.

6. The manufacturing method of the bump structure as claimed in claim 5, wherein the nickel layer extends and is configured between the second bump and a portion of the metal layer located on the insulating layer.

7. The manufacturing method of the bump structure as claimed in claim 1, wherein the step of forming the second bump comprises:
   forming a second patterned photoresist layer on a portion of the metal layer located on the insulating layer, wherein the second patterned photoresist layer has at least one fourth opening corresponding to the at least one second opening, the at least one fourth opening exposes the first bump located in the at least one first opening and the at least one second opening and exposes a portion of the metal layer located on the insulating layer;
   forming the second bump in the at least one fourth opening, wherein the second bump is stacked on the first bump; and
   removing the second patterned photoresist layer to expose a portion of the metal layer located below the second patterned photoresist layer.

8. A bump structure suitable for being configured on a substrate, the substrate having at least one pad and a passivation layer, the passivation layer having at least one first opening, the at least one first opening exposing a portion of the at least one pad, the bump structure comprising:
- an insulating layer configured on the passivation layer and having at least one second opening, the at least one second opening exposing a portion of the passivation layer and a portion of the at least one pad;
- an under bump metallurgic layer configured on a portion of the insulating layer, in the at least one first opening, and in the at least one second opening, wherein the under bump metallurgic layer covers an inner wall of the at least one first opening, an inner wall of the at least one second opening, and a portion of the passivation layer exposed by the at least one second opening;
- a first bump filling the at least one first opening and the at least one second opening, a portion of the under bump metallurgic layer being located between the first bump and the insulating layer, wherein a top surface of the first bump is lower than a top surface of the insulating layer; and
- a second bump stacked on the first bump and covering the first bump, wherein a portion of the second bump extends to a portion of the under bump metallurgic layer located on the insulating layer.

9. The bump structure as claimed in claim 8, wherein the first bump is a copper bump, and the second bump is gold bump.

10. The bump structure as claimed in claim 8, further comprising a nickel layer configured between the first bump and the second bump.

11. The bump structure as claimed in claim 10, wherein a bottom area of the nickel layer is greater than or substantially equal to an area of a diameter of the at least one second opening.

12. The bump structure as claimed in claim 8, wherein a bottom area of the second bump is greater than an area of a diameter of the at least one second opening.

13. The bump structure as claimed in claim 8, wherein the insulating layer is a hollow insulating tube, and a side of the second bump is substantially aligned to a side of the hollow insulating tube.

14. The bump structure as claimed in claim 13, wherein the first bump is a copper bump, and the second bump is gold bump.

15. The bump structure as claimed in claim 13, further comprising a nickel layer configured between the first bump and the second bump.

16. The bump structure as claimed in claim 13 wherein a bottom area of the second bump is greater than an area of a diameter of the at least one second opening.

* * * * *